United States Patent [19]

Nomura

[11] Patent Number: 4,694,403

[45] Date of Patent: Sep. 15, 1987

[54] EQUALIZED CAPACITANCE WIRING METHOD FOR LSI CIRCUITS

[75] Inventor: Minoru Nomura, Tokyo, Japan

[73] Assignee: NEC Corporation, Tokyo, Japan

[21] Appl. No.: 644,512

[22] Filed: Aug. 27, 1984

[30] Foreign Application Priority Data

Aug. 25, 1983 [JP] Japan ............................ 58-155583

[51] Int. Cl.$^4$ ............... H01L 27/02; H01L 27/10; H03H 21/00; H04B 3/00
[52] U.S. Cl. ................................ 364/488; 357/41; 357/45; 364/491
[58] Field of Search ............ 364/488, 490, 489, 491, 364/518; 357/45, 41

[56] References Cited

U.S. PATENT DOCUMENTS 3,638,202  1/1972  Schroeder ........................... 357/45
4,377,849  3/1983  Finger et al. ....................... 364/491

FOREIGN PATENT DOCUMENTS 0013088  7/1980  European Pat. Off. ............ 364/491

OTHER PUBLICATIONS

Trimberger, Stephen, "Automating Chip Layout", *IEEE Spectrum*, Jun. 1981, vol. 19, No. 6, pp. 38–45.
Daniel et al., "CAD Systems for IC Design", *IEEE Transactions on Computer Aided Design of Integrated Circuits and Systems*, vol. CAD-1, No. 1, Jan. 1982, pp. 2–12.
"IEEE Transactions on Mircrowave Theory and Techniques", Dec. 1966, vol. MTT-14, pp. 696 ∝ 698.
IBM Journal of Research and Development, vol. 25, No. 3, May, 1981 "Bipolar Circuit Design for a 5000-Circuit VLSI Gate Array" A. H. Dansky.
"Philo—A VLSI Design System", pp. 163–169, M. Jenkins et al 19th Design Automation Conference, 1982.

Primary Examiner—Gary Chin
Assistant Examiner—Daniel W. Juffernbruch
Attorney, Agent, or Firm—Burns, Doane, Swecker & Mathis

[57] ABSTRACT

A method for equalizing the capacitances of a plurality of circuits in order to compensate for different signal transmission delay times within an LSI circuit. The wiring capacitance of the individual circuits are measured and the maximum capacitance value in a circuit group is determined. An equalizing capacitance pattern, which has a capacitance corresponding to the difference between the maximum capacitance value and the capacitance value of an individual circuit, is applied to each individual circuit.

9 Claims, 11 Drawing Figures $S = \dfrac{Ca}{Co}$

| COMPENSATION CAPACITY VALUE | CAPACITY PATTERN | | |
|---|---|---|---|
| | RECTANGLE | WINDING | MESH |
| $\triangle C$ | ▭ | ⌇ | ▦ |
| $2\triangle C$ | ▭ | ⌇ | ▦ |
| ⋮ | ⋮ | ⋮ | ⋮ |

FIG. 6A

| | TERMINAL 82 | CAPACITANCE VALUE 83 | CAPACITANCE PATTERN SET POSITION (X, Y, DIRECTION) 84 |
|---|---|---|---|
| BLOCK 1 821 | 21 | 3 | 1, 10, 1 |
| | 22 | 3 | 10, 10, 1 |
| | 23 | 3 | 10, 1, 1 |
| | 24 | 3 | 1, 1, 1 |
| BLOCK 2 822 | P1 ⋮ | 6 ⋮ | △, △, △ ⋮ |

FIG. 6B

| | CIRCUIT NAME 86 | CAPACITANCE VALUE (PF) 87 | COMPENSATION CAPACITANCE 88 | CAPACITANCE PATTERN NAME 89 | CAPACITANCE PATTERN SET POSITION 891 |
|---|---|---|---|---|---|
| CIRCUIT GROUP 1 REQUIRING EQUALIZATION 85 | 45 | 10 | 5 | PATTERN 5 | 501, 310, 1 |
| | 46 | 15 | 0 | — | — |
| | 47 | 13 | 2 | PATTERN 2 | 510, 301, 1 |
| | 48 | 10 | 5 | PATTERN 5 | 501, 301, 1 |
| | | | | | |

FIG. 6C

| 1st COMPENSATION CAPACITANCE 810 | 2nd COMPENSATION CAPACITANCE 811 | CAPACITANCE PATTERN NAME 812 |
|---|---|---|
| 0.00 | 0.99 | PATTERN 0 |
| 1.00 | 1.99 | PATTERN 1 |
| 2.00 | 2.99 | PATTERN 2 |
| 3.00 | 3.99 | PATTERN 3 |
| 4.00 | 4.99 | PATTERN 4 |
| 5.00 | 5.99 | PATTERN 5 |
| ⋮ | ⋮ | ⋮ |

EQUALIZED CAPACITANCE WIRING METHOD FOR LSI CIRCUITS

BACKGROUND OF THE INVENTION

This invention relates to an equalized capacitance wiring method for facilitating the LSI (large scale integration) of data processing or communication systems.

Supply of clock signals to a logic circuit which includes one distributing gate and a plurality of flip-flops, and which is one portion of an LSI circuit, is carried out by feeding signals from an input terminal of the LSI circuit to each of the flip-flops via the distributing gate. Plural wirings formed on the LSI circuit for transmitting those clock signals can not be formed with identical patterns. A difference in a clock signal transmission delay time from the input terminal to each flip-flop of the LSI circuit, which is generally known as a clock skew occurs, consequently. It is indispensable, therefore, to minimize such a clock skew in order to realize a high-speed logical circuit with a shorter clock cycle time.

The delay time caused by the wiring in the LSI circuit is generally expressed by the following formula.

$$T_{pd} = \alpha C R + \beta$$

wherein:

$T_{pd}$ represents a delay time, C is a capacitance value, R is an output resistance at a block terminal, and $\alpha$, $\beta$ are constants determined by C and R.

According to the above formula, $T_{pd}$ between circuits may be equalized by adjusting values of C and R.

Technology for speed compensation of a critical path or wiring which has the maximum transmission time of the clock and data signals in an LSI circuit by varying such resistance R to adjust the delay time was proposed by A. H. Dansky in the IBM Journal of Research and Development, Vol. 25, No. 3, May 1981, pp. 116–125 under the title of "Bipolar Circuit Design for a 5000—Circuit VLSI Gate Array". Referring to FIG. 3 of this paper, there are provided resistors of 8 kΩ in parallel in a basic circuit wherein the use of either one resistor or both resistors is selected depending on the delay time of the circuit to obtain two values of resistance, i.e. 4 kΩ and 8 kΩ. The layout of those two resistors is made so that the wiring of a power supply source contacts selected ones of the resistors placed on a predetermined wiring area. In such a layout, since electric wiring is achieved within a predefined area (referred to as a block hereinafter), the respective arranged positions of blocks and the wired results between those blocks are not affected at all by that wiring. Evaluation and compensation of a delay time can, therefore, be carried out as a step subsequent to wiring. However, it is necessary to incorporate resistors in the basic circuit in advance and the resistors therefore must be given certain values within a limited scope. Additionally, such resistors cannot be fine-adjusted when used for delay time compensation. Varying resistance also entails increment/decrement of power and, therefore, an excessive amount of power will be necessary when a high-speed LSI is to be realized.

Another technology was disclosed by M. Jenkins et al in their paper "PHILO—A VLSI Design System" pp. 163–169, presented at 19th Design Automation Conference in 1982. The paper concerns the technology of preparing plural types of replaceable blocks having different power values and delay time and selecting the optimal block after wiring. This technology is advantageous in that without paying any special technical considerations to the placement of the circuit elements and the wiring to be provided inside of the blocks, a delay time can be compensated in a subsequent step. However, since the number and types of blocks which must be prepared in advance, will inconveniently increase, a time difference in the above-mentioned fine-adjustment made for the blocks occurs as a practical matter. In practice, since there is a limit in the number of elements which can be mounted on an LSI circuit, the number of resistors necessary for fine-adjustment of the delay time cannot be mounted on the LSI circuit. This makes fine-adjustment of the delay time in signal transmission impossible.

An object of this invention is, therefore, to provide an equalized capacitance wiring method for LSI circuits free of afore-described defects.

BRIEF SUMMARY OF THE INVENTION

According to one aspect of the invention, there is provided an equalized capacitance wiring method wherein circuit capacitances are equalized in order to compensate a signal transmission delay time within an LSI circuit by means of: plural capacitance patterns having predetermined plural types of capacitance values; and at least one block having at least one predetermined area and input and output terminals, said capacitance patterns being selectively placed on said area of said block, by the following steps;

the first step of inputting circuit connection information, block terminal position information and block configuration information;

the second step of achieving interblock placement based upon the information input in said first step;

the third step of carrying out interblock wiring based on the placement information obtained in the second step and the block terminal position information input in the first step;

the fourth step of calculating the capacitance of each circuit;

the fifth step of operating in response to the same clock given from outside and obtaining the maximum capacitance value within a circuit group which requires equalized capacitance;

the sixth step of calculating the difference between the maximum capacitance value obtained in the fifth step and the capacitance value of the circuit concerned and obtaining the value to be compensated, and selecting a capacitance pattern having the very capacitance to be compensated; the seventh step of compiling the placement/wiring results for mask pattern; and the eighth step of applying the pattern selected in the sixth step additionally to the mask pattern made in the seventh step in case that all the circuits needed equalized capacitance respectively.

BRIEF DESCRIPTION OF THE DRAWINGS

The objects, features and advantages of the present invention will become apparent from the following detailed description when read in conjunction with the accompanying drawings, in which:

FIGS. 6A through 6C are illustrative diagrams for describing the information necessry for processing/decision in one embodiment of the present invention.

Similar reference numerals in FIGS. 1 through 7B denote similar structural elements.

DETAILED DESCRIPTION OF THE PREFERRED EMBODIMENT

Figure 1:
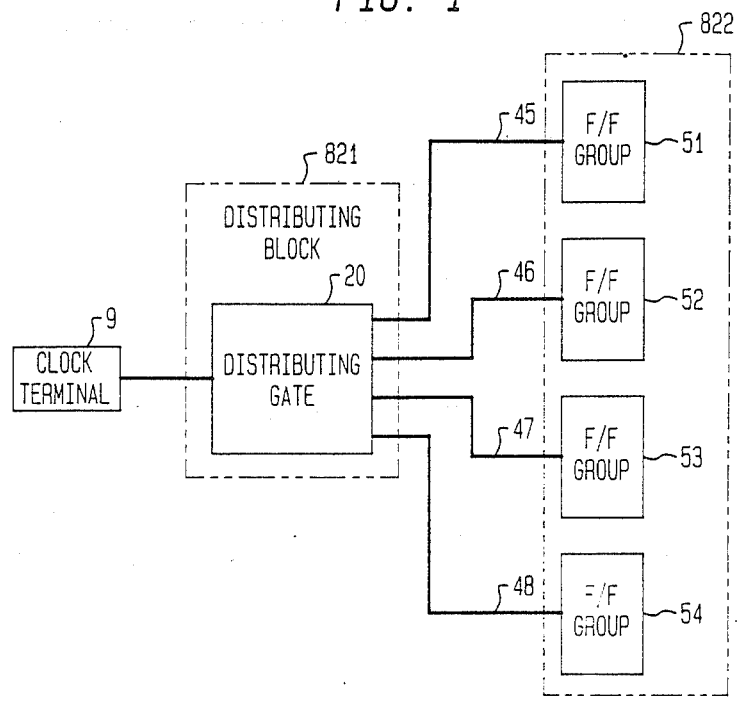
FIG. 1 is a block diagram of a signal distribution/circuit applicable to one embodiment of this invention.

Referring now to FIG. 1, the signal distribution circuit applicable to one embodiment of the invention, includes a clock terminal 9 which receives clock signals from outside, a distributing gate 20 which distributes clock signals received from the clock terminal 9, circuits 45 through 48 connected to the gate 20, and flip-flop groups 51 through 54 connected to the circuits 45 through 48.

Figure 2:
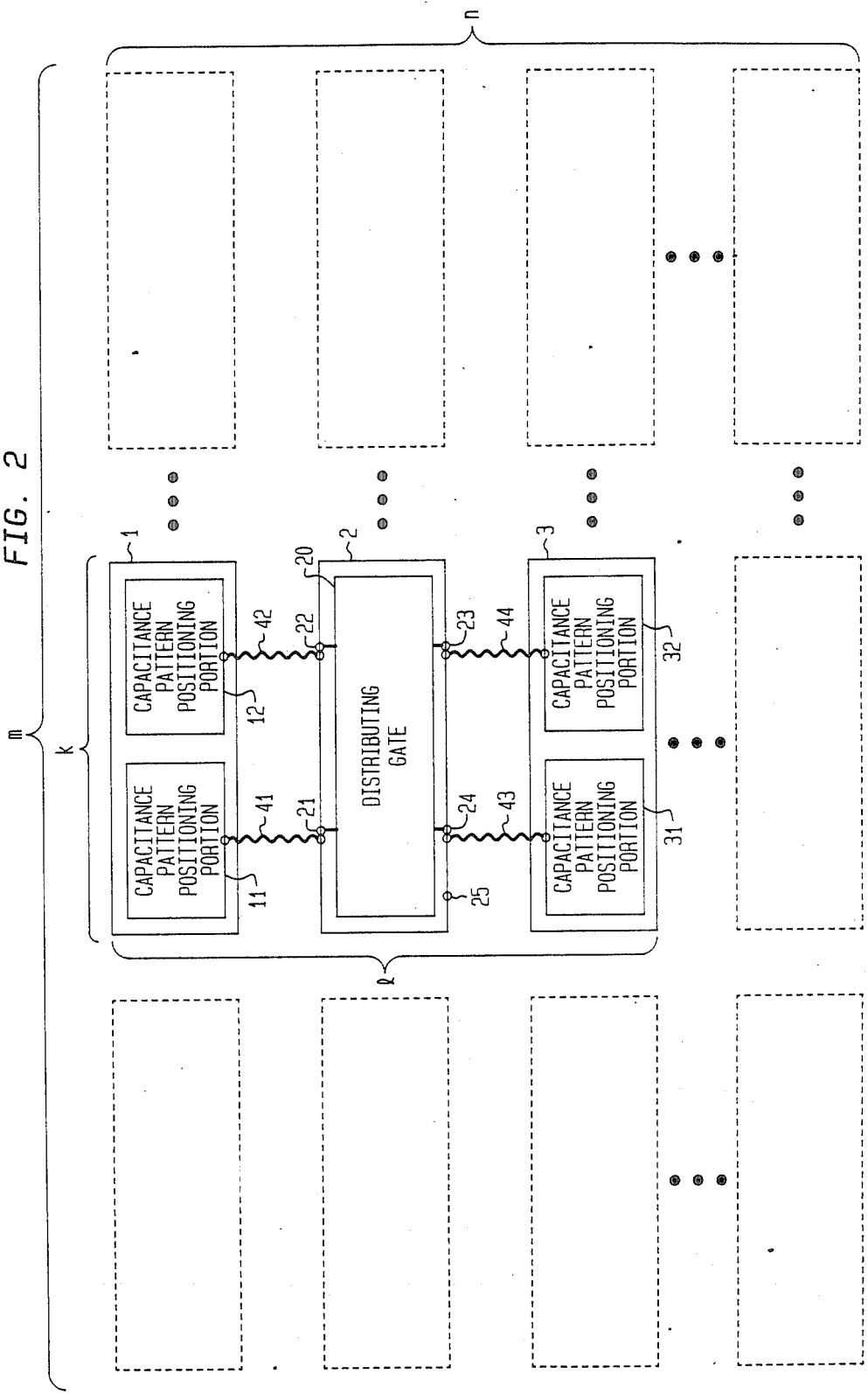
FIG. 2 is a block diagram of a signal distribution block of the circuit of FIG. 1.

Referring to FIG. 2, a signal distributing block 821 including the distributing gate 20 shown in FIG. 1 comprises a master slice LSI circuit composed of three cells 1 through 3. The master slice LSI circuit is structured by placing cells, on which transistors or resistor elements are positioned in advance, in an m×n matrix on an LSI circuit. The block for performing such functions as signal distribution on the master slice LSI circuit is materialized by arranging the cells in a matrix of k×l ($1 \leq k < m$, $1 \leq l < n$) and the metal-wiring between elements in the cells. In this method, a capacitance pattern positioning portion 11 for an output terminal 21 having a predetermined area and a capacitance pattern positioning portion 12 for an output terminal 22 having a predetermined area are reserved as unoccupied cells in advance in order to place capacitance patterns on the first cell 1.

Similarly, on the third cell 3 are positioned a capacitance pattern positioning portion 32 for an output terminal 23 and a capacitance pattern positioning portion 31 for an output terminal 24. The second cell is provided with a distributing gate 20, an input terminal 25, and output terminals 21 through 24.

Figure 3:
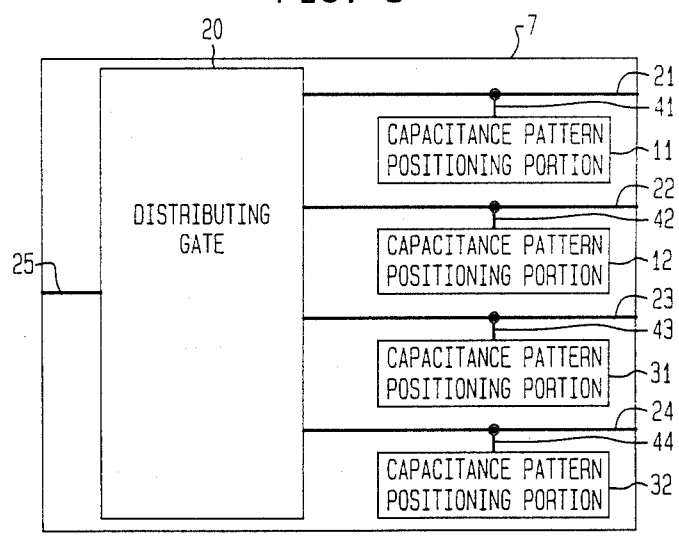
FIG. 3 is a block diagram of another signal distribution block of the circuit of FIG. 1.

Referring to FIG. 3, the signal distributing block 821 including the distributing gate 20 shown in FIG. 1, comprises building block LSI circuits. In the case of the building block LSI circuits, the LSI circuit is provided in advance with a block including a NAND gate or a flip-flop having a predetermined interior layout for simplifying the layout design of the overall circuit. The abovementioned master slice LSI circuit differs from this building block LSI circuit in that the area of a chip is not constant in the latter. Thus, the chip area in a building block LSI circuit should be minimized as much as possible by adopting a layout which minimizes the interblock space since the area occupied by a block 7 can not be reduced.

Inside the block 7 are formed capacitance pattern positioning portions 11, 12, 31 and 32, a distributing gate 20, an input terminal 25, output terminals 21 through 24 and connecting lines 41 through 44.

In the embodiment shown in FIGS. 2 and 3, the capacitance pattern positioning portions 11, 12, 31 and 32 are first formed as unoccupied areas, then in a subsequent step capacitance patterns selected for compensation of the delay due to inter-block wiring are placed in those areas.

The method of selecting a capacitance pattern for capacitance compensation will be described in more detail referring to FIGS. 4A and 4B. A capacitance is formed between a wiring pattern and a substrate, between a wiring pattern and a wiring pattern of another layer and between a wiring pattern and another wiring pattern of the same layer. Taking the influence from the above phenomenon into account, a capacitance value per unit area ($C_o$) is determined for each wiring layer. In programming a capacitance pattern, the area (S) on the layout is first determined for the capacitance ($C_a$) to be compensated and then a configuration of the pattern is determined to satisfy the area.

The area (S) is obtained by the following formula.

$$S = (C_a/C_o)$$

Figures 4A, 4B:
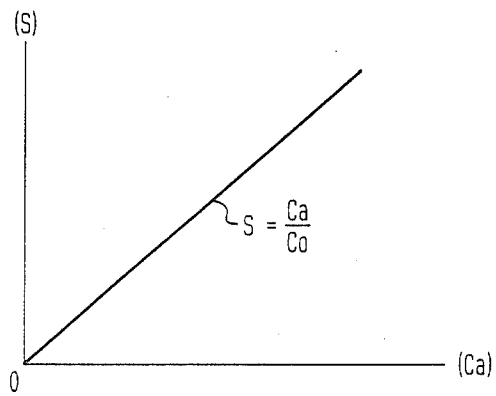
FIG. 4A is a graph used to describe a method of selecting a capacitance pattern for capacitance compensation.
FIG. 4B illustrates the physical representation of capacitance patterns for use with the present invention.

FIG. 4A shows the above relation. FIG. 4B shows some examples of the configuration of the capacitance patterns depending on the capacitance values to be compensated. The pattern may be shaped in a rectangular, winding or mesh pattern depending on the compensation capacitance values ($\Delta C$). If it is assumed that the capacitance per area ($C_o$) is $5 \times 10^{-5}$ picofarads (pF)/$\mu m^2$, the area of 2000 $\mu m^2$ will become necessary for compensating 0.1 pF. The number of capacitance pattern types is determined by the relationship between the variation in a compensation capacitance value ($\Delta C$) and the maximum of the capacitance compensation values.

The selected capacitance patterns are placed in the pattern positioning portions 11, 12, 31 or 32 (FIGS. 2 and 3) to become part of the wireline and therefore adjust the capacitance of the wire. Thus, a fine adjustment of the delay time encountered by a signal transmitted through the wire can be made.

A capacitance compensation method according to this invention will now be described hereinbelow with reference to the attached drawings.

Figure 5:
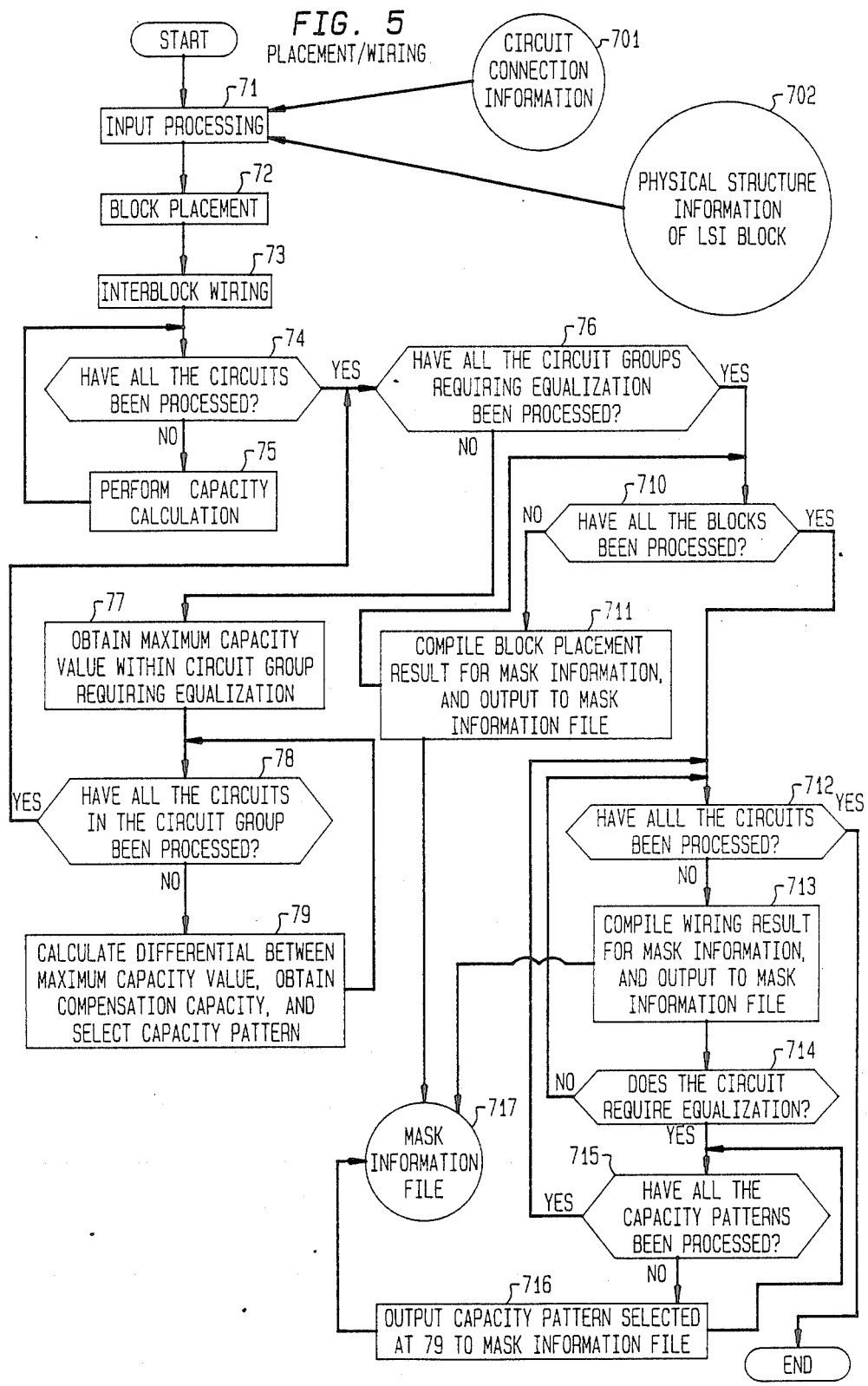
FIG. 5 is a flow diagram illustrating a method in accordance with the present invention.

Referring to FIG. 5, the control method used in an embodiment of this invention comprises plural processing boxes and decision boxes. These processing and decision operations may be performed by operating a computer with a program which is designed according to FIG. 5. It may also be executed in hardware. Alternatively, all the processing and decision operations may be conducted manually. Whatever the means, the results obtained will be identical. Therefore, description will be given only to the case where such operations are executed by running a computer program. FIGS. 6A through 6C show various information necessary for processing and decision shown in FIG. 5. They are generally stored in a memory of a computer. In FIG. 6A, there are illustrated terminal capacitances 83 at each terminal 82 and its capacitance pattern set position 84. The blocks 821 and 822 correspond to the distributing gates 20 or flip-flops 51 through 54. There is no information for the capacitance pattern set position 84 of the block 822 which does not have any capacitance pattern set areas. FIG. 6B shows the information concerning the circuits required to be equalized in capacitance. The information includes the circuit name 86 in the particular group, capacitance 87, compensation capacitance 88, the name of the capacitance pattern 89, the capacitance pattern set position 891, for each circuit group 85. The circuit group 85 which requires capacitance equalization corresponds to the group of circuits 45 through 48 which are shown in FIG. 1. In the column for the name of the circuit 86, therefore, the circuits 45 through 48 are listed. The capacitance 87 and the compensation capacitance 88 are stored in a memory of a computer after calculation of capacitance. The capacitance pattern name 89 and the capacitance pattern set position 891 are stored in the computer after a particular capacitance pattern is selected. At the initial stage, therefore, only the circuit names 86 are stored in the computer memory.

FIG. 6C shows the correspondence between the compensation capacitance and the capacitance pattern name. The relation between the first compensation capacitance 810 and the second compensation capacitance 811 is expressed as the first compensation capacitance 810 < the second compensation capacitance 811. The capacitance pattern name 812 is selected so as to compensate the difference between the first and the second compensation capacitances 810 and 811. Ideally, one pattern anme should be assigned to each compensation capacitance value. In that case the number of patterns may become excessively large, and therefore, in the preferred embodiment, the compensation capacitance values are grouped to share a common capacitance pattern limiting the total number of patterns necessary for equalization.

Based upon the above basic information, an embodiment of this invention will be explained.

Placement/Wiring

Referring to FIG. 5, circuit connection information 701 and physical structure information 702 of a block including terminal position information and configuration information are input in a processing box 71, and the interblock placement relation is determined in a processing box 72. Then a processing box 73 decides interblock wiring based upon the placement information, the block terminal position information and the circuit connection information.

Capacitance Equalization

The capacitance calculation per circuit is conducted for all the circuits. Whether all the circuits have been processed or not is judged by a decision box 74 and if judged affirmative ("YES"), the processing goes on to a decision box 76. If not, the processing goes to a processing box 75 and the capacitance calculation continues for respective circuits.

The capacitance of a circuit is calculated by the equation, $C = C_w + C_t$ (wherein $C_t$: terminal capacitance and $C_w$: wiring capacitance).

In order to obtain a terminal capacitance value $C_t$, it is necessary to learn the block 821 or 822 and the terminal name 82 from component blocks and terminals of the particular circuit, and then to extract a capacitance value 83 from the above learned results. The terminal capacitance value is obtained by summing all the terminal capacitance values thus extracted. The wiring capacitance value $C_w$ is obtained by using the equation below.

$$C_w = \sum_{i=1}^{2} \frac{l_i \times W_i}{C_{oi}} \quad (i = \text{wiring layer})$$

wherein:
the total wire length of each wiring layer: $l_i$
wire width of each wiring layer: $W_i$ capacitance value per unit area of each wiring layer: $C_{oi}$
(In this case, the number of wiring layers is assumed to be two).

By summing the wiring capacitance $C_w$ and the terminal capacitance $C_t$ the capacitance of a particular circuit can be determined. If the particular circuit has been registered in FIG. 6B as a circuit requiring capacitance equalization, the capacitance value which has been calculated as above is stored as the capacitance value 87 corresponding to the particular circuit name 86. If the circuit is not registered as one requiring capacitance equalization, the above processing is not necessary.

The decision box 76 judges whether or not all the circuit groups 85 which needed capacitance equalization have been processed, and if judged affirmative, processing will go on to the decision box 710. If not, the processing goes to the processing box 77. In the processing box 77, the maximum value among the circuit groups needing capacitance equalization is obtained by comparing respective capacitance values 87 of each circuit 86 in the circuit group 85 which needs equalization.

The decision box 78 judges whether or not all the circuits of circuit group have been processed, and if judged affirmative, the processing goes on to a decision box 76 and next circuit group comes in the box for processing. If not, the processing goes to a processing box 79. The processing box 79 calculates the difference between the maximum capacitances value obtained in the processing box 77 and the capacitance value of the circuit shown in FIG. 6B, the compensation capacitance value 88 is obtained and a pattern is selected. More particularly, whether or not the compensation capacitance value falls between the first and the second compensation capacitance values 810 and 811 is examined, and if it does, a capacitance pattern 812 which corresponds to the designated range including the above compensation capacitance value is obtained and the name of the capacitance pattern 89 is selected for the circuit shown in FIG. 6B. Then, the set position 891 of the circuit shown in FIG. 6B will be determined by totaling the position of the block on LSI and the capacitance pattern set position 84 in the block shown in FIG. 6A, and by obtaining the absolute coordinate on LSI.

If there are present in the circuit plural terminals where capacitance pattern can be plotted and if the capacitance compensation can not be conducted by using only one capacitance pattern, other capacitance patterns in a number depending on the capacitance value which has not been compensated will be selected. The name of the circuit 86, the capacitance pattern name 89, and the capacitance pattern set position 891 will be stored in a computer memory. When processing in all the processing boxes is finished, the processing returns to the decision box 78.

Mask Information Generation

The decision box 710 judges whether or not all the blocks have been processed for conversion to mask information.

If judged affirmative, then the processing goes to a decision box 712. If not, the next process proceeds to a processing box 711. The box 711 compiles the placement result in the form suitable for the mask information to output the same to a mask information file 717. After this, the processing returns to the decision box 710.

The decision box 712 judges whether or not all the circuits have been processed for conversion to mask information, and if judged affirmative, then the processing will end. If not, it goes to a processing box 713 for further processing.

The processing box 713 compiles the results of wiring in the form suitable for the mask information, outputs the same to a mask information file 717 and the processing goes on to a decision box 714.

The decision box 714 judges whether or not the circuit is one of the circuits needing capacitance equalization, and if negative the processing returns to the decision box 712. If affirmative, it goes to a decision box 715.

The decision box 715 judges whether or not the positioning of capacitance patterns has finished for this particular circuit and if it has, the processing will return to the decision box 712. If it has not, the processing goes to a processing box 716. The processing box 716 positions the capacitance pattern 89 which has been selected by the processing box 79 shown in FIG. 6B at a position 891 and outputs the same to a mask information file 717. The processing returns to the decision box 715 after the processing box 716.

Figure 7A:
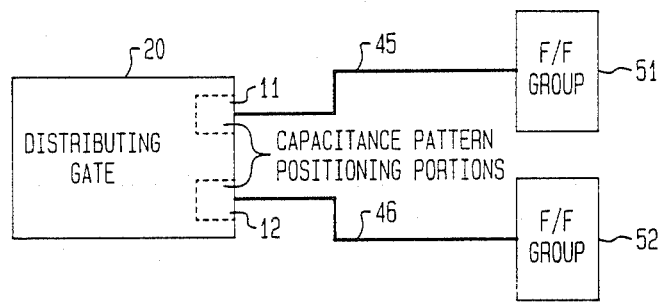
FIGS. 7A and 7B illustrate circuit examples with the equalized capacitance in accordance with the preferred embodiment of the present invention.
Figure 7B:
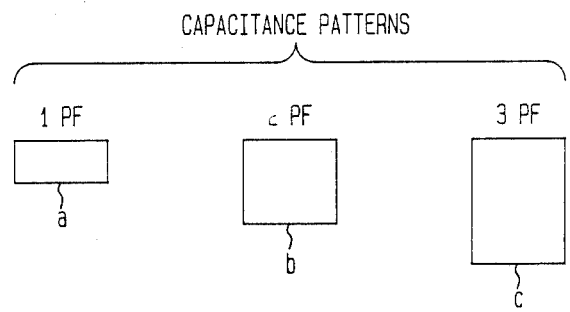

An example of a circuit formed with the capacitance equalization implementation method explained above is shown in FIG. 7A. The figure shows a distributing gate 20 having pattern positioning portions 11 and 12, flip-flop groups 51 and 52, circuits 45 and 46 which connect the gate 20 and the flip-flop groups 51 and 52. If it is assumed that the capacitance calculation of circuits which is conducted in the processing box 75 reveals that the capacitance value of the circuit 45 is 10 pF, that of circuit 46 is 8 pF, and if capacitance equalization is needed between the circuit 45 and the circuit 46, the processing by the processing box 79 of FIG. 5 indicates the capacitance should be compensated by 2 pF in the circuit 46. A corresponding pattern b thereto is selected as shown in FIG. 7B. The selected pattern b is positioned in a capacitance pattern set position 12 by the processing in the box 716. The capacitances are equalized by the above steps.

According to this invention, capacitance equalization can be achieved after placement and wiring without affecting the layout. This invention can also avoid complexity in wiring programs which might be caused in capacitance equalization by the changing wiring method as often seen in the prior art. Clock skew can also be fine-adjusted by expanding capacitance patterns. Moreover, power usage does not necessarily increase with adjustments in wiring delay.

The principles, preferred embodiments and modes of operation of the present invention have been described in the foregoing specification. The invention which is intended to be protected herein, however, is not to be construed as being limited to the particular forms disclosed, since these are to be regarded as illustrative rather than restrictive. Variations and changes may be made by those skilled in the art without departing from the spirit of the invention.

What is claimed is:

1. An equalized capacitance wiring method for LSI circuits or the like wherein circuit capacitances are equalized in order to compensate a signal transmission delay time within an LSI circuit by means of a plurality of capacitance patterns having predefined plural types of capacitance values; and at least one block having at least one predetermined area and input and output terminals, said capacitance patterns being selectively placed on said area of said block by the processing steps of:
    inputting circuit connection information, terminal position information of a block and configuration information of a block;
    achieving interblock placement based upon the information input by said inputting step;
    wiring between blocks based upon the placement information obtained by said achieving step and the block terminal position information and the circuit connection information input in said inputting step;
    calculating the capacitances of all the circuits;
    obtaining the maximum capacitance value which requires capacitance equalization in response to an identical clock provided by an external source;
    calculating the difference between the maximum value obtained by said obtaining step and the capacitance value which should be compensated and selecting a capacitance pattern which has the compensation value;
    compiling the results of placement and wiring for mask pattern; and
    applying the pattern selected in said difference calculating step if each of said all the circuits need capacitance equalization.

2. A method for equalizing the individual capacitances of a group of individual circuits in an LSI circuit in order to compensate for different signal transmission delay times in the individual circuits, comprising the steps of:
    calculating the capacitance of each of the individual circuits in a circuit group;
    determining the maximum capacitance value for said individual circuits;
    calculating the difference between said maximum capacitance value and the capacitance value of each individual circuit to provide a compensation value for each individual circuit; and
    applying an equalizing capacitance pattern in said individual circuits to provide said signal transmission delay time compensation, said capacitance pattern having a value which corresponds to said compensation value.

3. The method of claim 2, wherein the equalizing capacitance pattern is selected from a plurality of capacitance patterns each having a different capacitance value.

4. The method of claim 2, wherein said individual circuits includes a predefined area on which said equalizing capacitance patterns are applied by said applying step.

5. The method of claim 4, wherein the equalizing capacitance pattern is selected from a plurality of capacitance patterns each having a different capacitance value.

6. The method of claim 5, wherein said applying step includes forming a mask pattern and applying the mask pattern to said LSI circuit.

7. A method for compensating a signal transmission delay time in a LSI circuit which includes a plurality of individual circuits and at least one block having input and output terminals and a predefined area in which electric wiring is placed, comprising the step of applying a capacitance pattern having a predetermined capacitance value onto said predetermined area of said block, thereby to insert an equalizing capacitance in said individual circuits to provide said signal transmission delay time compensation.

8. The method of claim 7, including the preliminary steps of:

calculating the optimum wiring pattern between blocks based upon block placement information and block input and output terminal information;

wiring between blocks in the pattern determined by said calculating step;

calculating the capacitances of each of said individual circuits;

determining the maximum capacitance value for said individual circuits; and subtracting the capacitance value of each individual circuit from the maximum capacitance to provide a compensation value for each individual circuit, said equalizing capacitance having a value corresponding to said compensation value.

9. The method of claim 8, wherein the applying step includes the step of compiling the block placement, wiring and compensation capacitance information in order to form a mask pattern.

* * * * *